United States Patent
Kojima (10) Patent No.: US 10,176,873 B2
(45) Date of Patent: Jan. 8, 2019

(54) SEMICONDUCTOR MEMORY DEVICE AND READING METHOD THEREOF

(71) Applicant: Winbond Electronics Corp., Taichung (TW)

(72) Inventor: Hidemitsu Kojima, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/798,402

(22) Filed: Oct. 31, 2017

(65) Prior Publication Data
US 2018/0130534 A1 May 10, 2018

(30) Foreign Application Priority Data
Nov. 4, 2016 (JP) ................................. 2016-216054

(51) Int. Cl.
| | |
|---|---|
| G11C 16/10 | (2006.01) |
| G11C 16/08 | (2006.01) |
| G11C 16/04 | (2006.01) |
| G11C 16/26 | (2006.01) |
| G11C 16/32 | (2006.01) |

(52) U.S. Cl.
CPC .......... *G11C 16/08* (2013.01); *G11C 16/0483* (2013.01); *G11C 16/26* (2013.01); *G11C 16/32* (2013.01)

(58) Field of Classification Search
CPC ................................ G11C 16/10; G11C 16/26
USPC ........................................ 365/185.17, 185.24
See application file for complete search history.

(56) References Cited

U.S. PATENT DOCUMENTS

| | | | | |
|---|---|---|---|---|
| 4,247,920 A | * | 1/1981 | Springer ................ | G06F 12/04 365/230.04 |
| 5,392,254 A | * | 2/1995 | Toda .................... | G11C 7/1006 365/189.12 |
| 6,154,416 A | | 11/2000 | Lee et al. | |
| 2002/0097202 A1 | * | 7/2002 | Park ...................... | G09G 3/293 345/60 |
| 2006/0119378 A1 | * | 6/2006 | Tonami .................. | G06F 21/14 326/8 |

(Continued)

FOREIGN PATENT DOCUMENTS

| | | |
|---|---|---|
| JP | 2012253591 | 12/2012 |
| TW | 399204 | 7/2000 |

OTHER PUBLICATIONS

"Office Action of Taiwan Counterpart Application," dated Jul. 3, 2018, pp. 1-8.

*Primary Examiner* — Michael Tran
(74) *Attorney, Agent, or Firm* — JCIPRNET (57) ABSTRACT

A semiconductor memory device and a reading method thereof are provided. A flash memory includes a memory cell array; a page buffer/reading circuit, holding data of a selected page of the memory cell array; a decoding/selecting circuit, selecting n bits data from the data held by the page buffer based on a column address; and a data bus for n bits, which is connected to the decoding/selecting circuit. The decoding/selecting circuit further connects n/2 bits data of an even address to a lower bit position of the data bus and connects n/2 bits data of an odd address to a upper bit position of the data bus based on the column address. When the start address is the odd address, data of the odd address and data of the even address next to the odd address are selected.

12 Claims, 10 Drawing Sheets

(56) References Cited

U.S. PATENT DOCUMENTS

| | | | |
|---|---|---|---|
| 2006/0268028 A1* | 11/2006 | Saruta | B41J 2/17513 347/9 |
| 2007/0147113 A1* | 6/2007 | Mokhlesi | G11C 16/28 365/185.03 |
| 2007/0171744 A1* | 7/2007 | Mokhlesi | G11C 11/5628 365/203 |
| 2008/0184094 A1* | 7/2008 | Murray | G06F 11/1072 714/763 |
| 2009/0216946 A1 | 8/2009 | Sun | |
| 2012/0221809 A1* | 8/2012 | Yoshikawa | G06F 3/0613 711/155 |
| 2013/0215020 A1* | 8/2013 | Matsuda | G06F 3/03 345/157 |
| 2015/0363351 A1* | 12/2015 | Sato | G06F 13/28 710/105 |
| 2016/0004642 A1* | 1/2016 | Sugimoto | G06F 3/06 711/128 |
| 2016/0378590 A1* | 12/2016 | Roh | G11C 29/52 714/768 |
| 2017/0148517 A1* | 5/2017 | Harari | G11C 16/0466 |
| 2018/0173598 A1* | 6/2018 | Zeng | G06F 12/02 |
| 2018/0211969 A1* | 7/2018 | Lue | H01L 27/11582 |
| 2018/0226108 A1* | 8/2018 | Kwon | G11C 7/1012 |

* cited by examiner

Reading sequence of data bus

Reading sequence of data bus

Reading sequence of data bus

FIG. 12B

SEMICONDUCTOR MEMORY DEVICE AND READING METHOD THEREOF

CROSS-REFERENCE TO RELATED APPLICATION

This application claims the priority benefit of Japan application serial no. 2016-216054, filed on Nov. 4, 2016. The entirety of the above-mentioned patent application is hereby incorporated by reference herein and made a part of this specification.

BACKGROUND OF THE INVENTION

Field of the Invention

The invention relates to a semiconductor memory device, and particularly relates to a reading method of a NAND flash memory.

Description of Related Art

In a NAND flash memory, data reading and data programming are performed in a unit of page, and data of the pages is stored in a page buffer. A flash memory disclosed in Japan Patent Publication No. 2012-253591 has a first mode adapted to transfer data stored in the page buffer in a first bit width and a second mode adapted to transfer data in a second bit width for corresponding to a plurality of operation modes.

Problems to be Resolved

The NAND flash memory is configured with a serial interface adapted to input/output data in series with fewer terminals. The serial interface is, for example, a serial peripheral interface with a standard of 8-bit command code and 24-bit address.

Figure 1A:
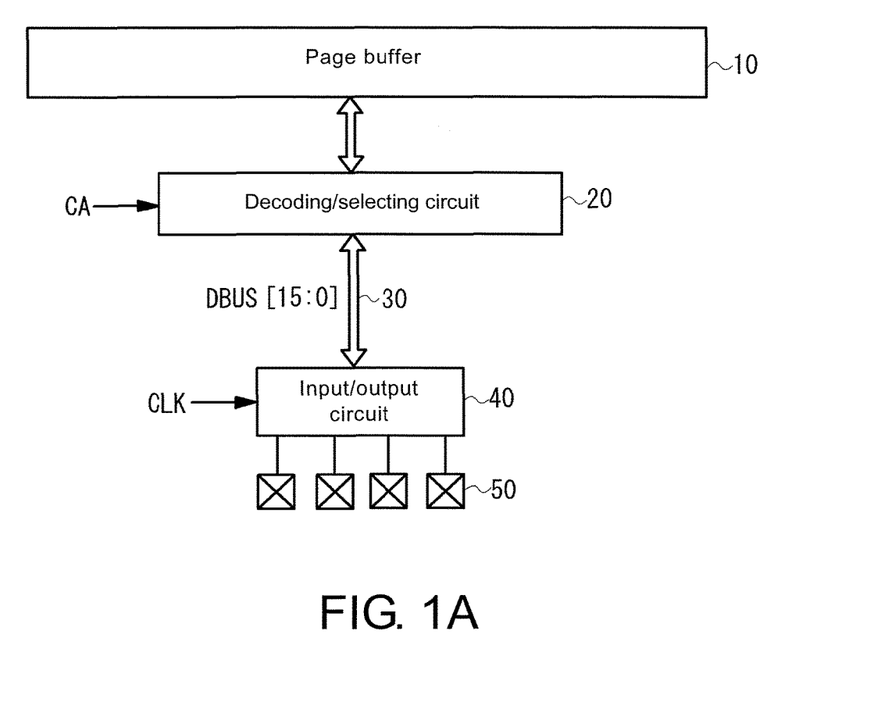
FIG. 1A and FIG. 1B are diagrams illustrating maim parts of a conventional NAND flash memory.
Figure 1B:
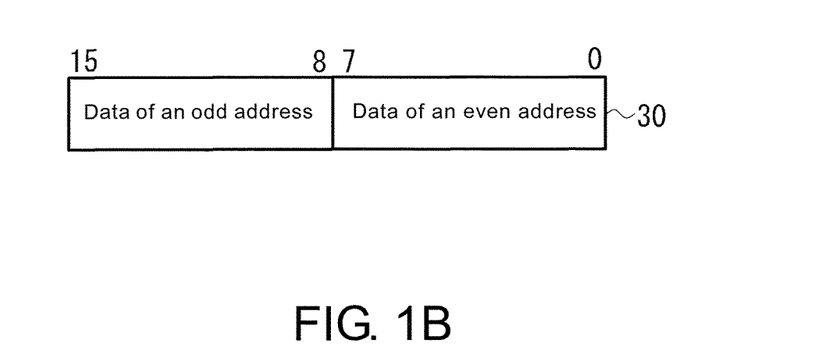

FIG. 1A and FIG. 1B are diagrams illustrating maim parts of the NAND flash memory with a serial interface function. A page buffer 10 holds page data read from a memory cell array or page data to be programmed to the memory cell array. A decoding/selecting circuit 20 decodes a column address CA, and selects n bits (n column) from the page buffer 10 based on a decoding result, and connects the selected n bits data to a data bus 30. The n bits selected by the decoding/selecting circuit 20 is equal to a bit width of the data bus 30, and if the data bus 30 has 16 bits width, the decoding/selecting circuit 20 selects 16 bits data in one selection. In case of a reading operation, the data selected from the page buffer 10 is transferred to an input/output circuit 40 through the data bus 30, and in case of a programming operation, the data held by the input/output circuit 40 is transferred to the selected column of the page buffer 10 through the data bus 30.

As shown in FIG. 1A, the input/output circuit 40 includes 4 external terminals 50, and controls data input/output in synchronous with a serial clock signal CLK. For example, in case that 8 bits data is output in series, 4 bits are output in one clock, and totally two clocks CLK are required for outputting the 8 bits data.

When the data bus 30 has 16 bits width, the decoding/selecting circuit 20 selects 16 bits data in each reading operation, and performs a selection for connecting the 16 bits data to the data bus 30. Namely, the decoding/selecting circuit 20 uses lower bit position 2 bits of the column address to connect the 16 bits data to upper bit position 8 bits [15:8] and lower bit position 8 bits [7:0] of the data bus 30. Now, as shown in FIG. 1B, data of an odd column address [2n+1] is connected to the upper bit position 8 bits [15:8] of the data bus 30, and data of an even column address [2n] is connected to the lower bit position 8 bits [7:0].

Figure 2A:
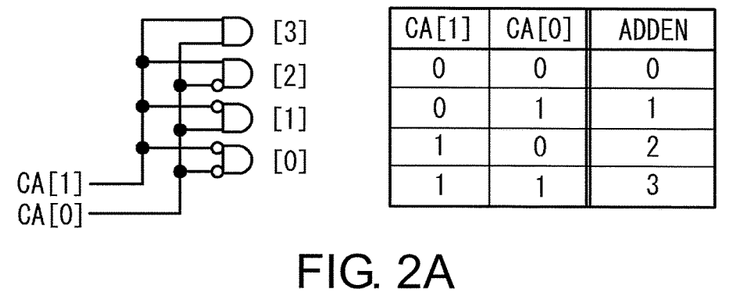
FIG. 2A is an example of selecting one address of a data bus according to two column addresses.

FIG. 2A is an example of a decoding circuit selecting one address in one reading operation by using 2 bits of column addresses CA[0], CA[1] and a truth table thereof. The aforementioned addresses are addresses used for selecting the upper bit position 8 bits or lower bit position 8 bits of the data bus 30. For example, if the column addresses CA[1], [0] are all "0", the address (ADDEN) 0 is selected, and if the column addresses CA[1], [0] are all "1", the address (ADDEN) 3 is selected. The addresses (ADDEN) 0, 1, 2, 3 correspond to the lower bit position 8 bits and the upper bit position 8 bits of the data bus 30.

Figure 2B:
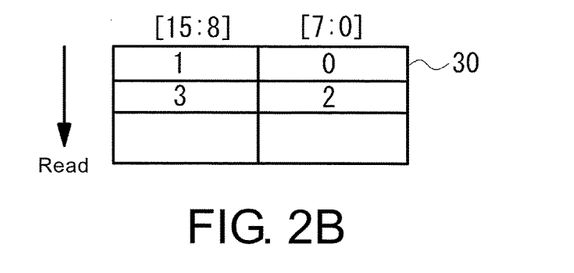
Figure 2C:
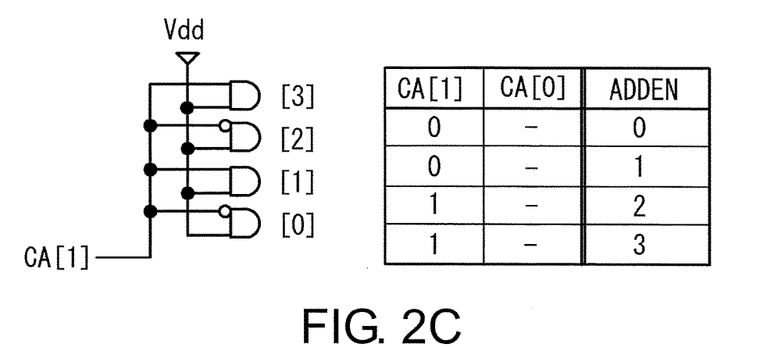
FIG. 2C is an example of selecting two addresses of the data bus according to two column addresses.
Figure 2D:
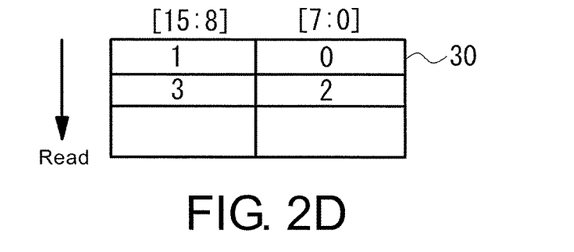

FIG. 2C is an example of a decoding circuit selecting two addresses in one reading operation by using 2 bits of column addresses CA[0], CA[1] and a truth table thereof. The decoding circuit simultaneously selects two addresses corresponding to an electrical level of the column address CA[1] by neglecting the column address CA[0] (in FIG. 2C, CA[0] is fixed to "1" of Vdd). For example, when the column address CA[1] is "0", the decoded addresses are "0" and "1", the lower bit position 8 bits and the upper bit position 8 bits of the data bus 30 shown in FIG. 2B are selected, and data of the even address and data of the odd address are connected thereto. Then, when the column address CA[1] is "1", the decoded addresses are "2" and "3", and data of the even address and data of the odd address are connected to the lower bit position 8 bits and the upper bit position 8 bits of the data bus 30.

Figure 3A:
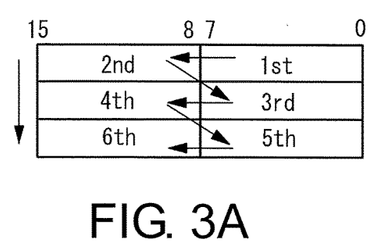
FIG. 3A illustrates a reading sequence of the data bus when a start address is an even address.

In a product implementing serial reading, automatic increment of a start address is implemented through an address counter, etc., and data read from the start address is sequentially loaded to the input/output circuit 40, and is output through the external terminal 50. When the start address is the even address, the input/output circuit 40 outputs the lower bit position 8 bits data of the even address, and then outputs the upper bit position 8 bits data of an odd address, and then alternately outputs data of the even address and data of the odd address. FIG. 3A illustrates a data reading sequence of the data bus when the start address is an even address.

Figure 3B:
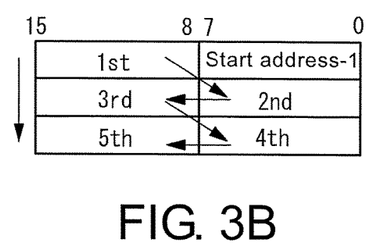
FIG. 3B illustrates a reading sequence of the data bus when the start address is an odd address.

On the other hand, when the start address is an odd address, the input/output circuit 40 outputs the upper bit position 8 bits data of the odd address, and then outputs the lower bit position 8 bits data of an even address. FIG. 3B illustrates a data reading sequence of the data bus when the start address is an odd address. As shown in FIG. 3B, when the start address is the odd address, data of the even address of the start address−1 is read from the lower bit position 8 bits, i.e. the data of the even address next to the start address is obtained through a following reading operation. After the decoding/selecting circuit 20 outputs data of the odd address, the decoding/selecting circuit 20 immediately selects next 16 bits data from the page buffer 10, and updates the data bus 30.

Figure 4A:
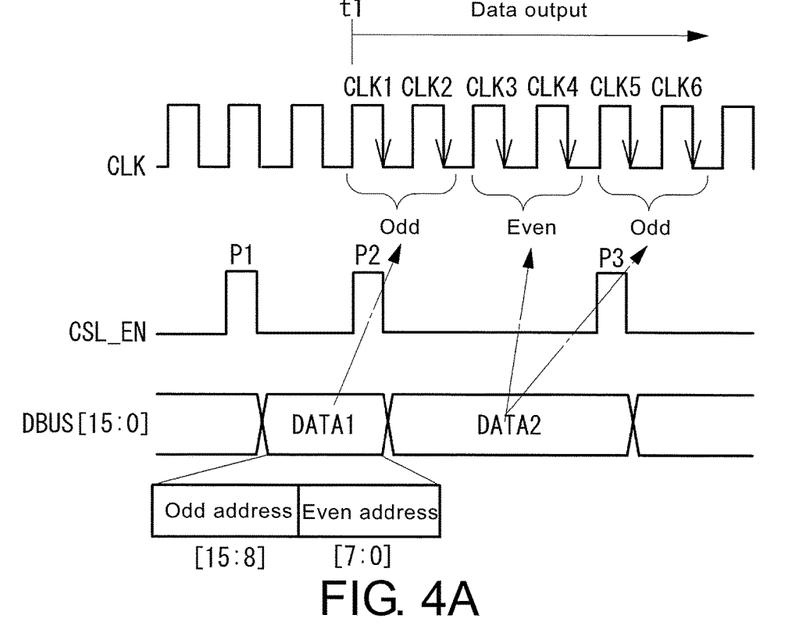
FIG. 4A and FIG. 4B are timing diagrams of a serial reading operation of the conventional flash memory when the start address is an odd address.
Figure 4B:
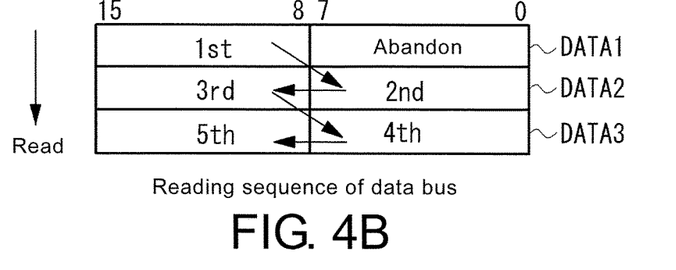

FIG. 4A and FIG. 4B are timing diagrams of a serial reading operation when the start address is an odd address. The decoding/selecting circuit 20 selects 16 bits data DATA1 from the page buffer 10 in response to a pulse P1 of a column selection signal CSL_EN, and connects the data DATA1 to the data bus 30. The input/output circuit 40 starts outputting data at a time t1, and outputs data of the upper bit position 8 bits [15:8] of the data DATA1 in synchronous with clocks CLK1, CLK2.

Then, during the outputting process of the data DATA1, the decoding/selecting circuit 20 selects next 16 bits data DATA2 from the page buffer 10 in response to a pulse P2 of the column selection signal CSL_EN, and connects the data DATA2 to the data bus 30. Thereafter, the input/output circuit 40 outputs data of the lower bit position 8 bits [7:0] of the data DATA2 in synchronous with clocks CLK3, CLK4. Then, after the upper bit position 8 bits data of the data DATA2 is output in synchronous with clocks CLK5, CLK6, the decoding/selecting circuit 20 selects 16 bits data DATA3 from the page buffer 10 in response to a pulse P3 of the column selection signal CSL_EN, and connects the data DATA3 to the data bus 30.

In this way, in case that the start address is the even address, update of the data bus 30 is fixed, though in case of the odd address, as shown in FIG. 4B, the data of the even address DATA1 has to be abandoned, and then the data of the even address data DATA2 is read, so that a period between the pulses P1 and P2 of the column selection signal CSL_EN is shortened, and an internal timing margin is reduced, which causes a boundary of an operation with a high clock frequency.

SUMMARY OF THE INVENTION

The invention is provided to resolve the aforementioned problem, and is directed to a semiconductor memory device and a reading method thereof capable of implementing high-speed data reading regardless of whether a start address is an odd address or an even address.

Solution of the Problem

The invention provides a semiconductor memory device including a memory cell array, a row selection part used for selecting a row of the memory cell array; a holding part used for holding data selected by the row selection part; a selecting part used for selecting n bits data from the data held by the holding part based on a column address; and a data bus for n bits, which is connected to the selecting part. The selecting part connects n/2 bits data of an even address to a lower bit position of the data bus and connects n/2 bits data of an odd address to an upper bit position of the data bus based on the column address. When a start address is the odd address, the selecting part selects data of the odd address and data of the even address next to the odd address.

The invention provides a reading method of a semiconductor memory device, where the semiconductor memory device includes a memory cell array, a row selection part used for selecting a row of the memory cell array; a holding part used for holding data selected by the row selection part; a selecting part used for selecting n bits data from the data held by the holding part based on a column address; and a data bus for n bits, which is connected to the selecting part. In case that a start address is an odd address, the selecting part connects data of the odd address and data of an even address next to the odd address to the data bus based on the column address, and outputs the data of the even address after outputting the data of the odd address connected to the data bus.

Effect of the Invention

According to the invention, in case that the start address is an odd address, the data of the odd address and the data of the even address next to the odd address are selected from the holding part, and the selected data is connected to the data bus, so that even if the start address is the odd address, it is unnecessary to abandon the data of the even address, so as to achieve non-waste data reading. Therefore, an updating time of the data bus in case that the start address is the odd address is complied with an updating time of the data bus in case that the start address is the even address, so as to set a margin of a reading timing to be the same. Therefore, according to the invention, when n bits data is selected from the data held by the holding part, in case that the start address is not a head address of the data bus for n bits, one or a plurality of data of addresses except the head address and data of the address after carry are selected, so that whatever the start address is, the updating time of the data bus is consistent, and the margin of the reading timing is set to be the same.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2D are diagrams illustrating decoding examples of a decoding/selecting circuit shown in FIG. 1A and FIG. 1B.

FIG. 9A and FIG. 9B illustrate a decoding/selecting circuit according to an embodiment of the invention.

DESCRIPTION OF EMBODIMENTS

Embodiments of the invention are described below with reference of figures. A semiconductor memory device of the invention may be an NAND flash memory or a semiconductor memory device embedded with such flash memory. In a preferable pattern, the NAND flash memory has a serial interface. However, the NAND flash memory may also have the serial interface and a parallel interface. The serial interface, for example, includes a terminal used for inputting a serial clock SCK, a terminal used for inputting/outputting data, a terminal implementing chip selection that makes input/output of instructions or addresses becomes possible, etc. Moreover, in the semiconductor memory device of the invention, the amount of external terminals is arbitrary, which is not limited by the invention.

EMBODIMENTS

Figure 5:
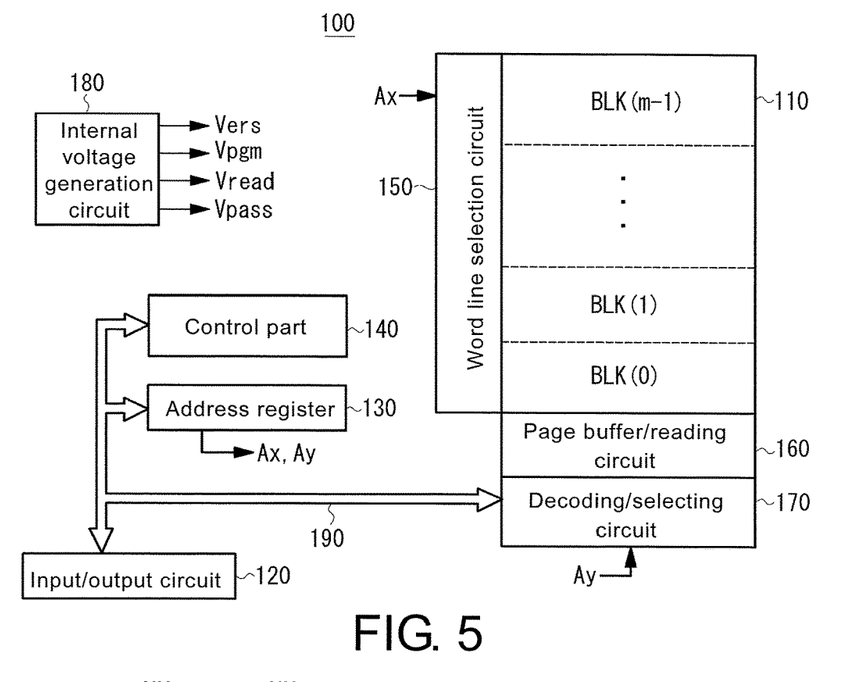
FIG. 5 is a schematic composition diagram of a NAND flash memory according to an embodiment of the invention.

FIG. 5 is composition diagram of a NAND flash memory 100 according to an embodiment of the invention. The NAND flash memory 100 may include a memory cell array 110, which includes a plurality of memory cells arranged in an array; an input/output circuit 120, which is connected to an external terminal; an address register 130, which receives address data coming from the input/output circuit 120; a control part 140, which controls a reading, programming, erasing operation, etc. based on a command (instruction) coming from the input/output circuit 120 or an external control signal (a chip selection signal CS, a write protection signal WP, etc.); a word line selection circuit 150, which decodes row address information Ax coming from the address register 130, and selects a block or a page of the memory cell array 110 based on the decoding result; a page buffer/reading circuit 160, which holds data read from the memory cell array 110, or holds data to be programmed to the memory cell array 110; a decoding/selecting circuit 170, which decodes column address information Ay coming from the address register 130, and selects a bit line based on the decoding result; and an internal voltage generation circuit 180, which produces voltages (a programming voltage Vpgm, a passing voltage Vpss, a reading voltage Vread, an erasing voltage Vers) required by the reading, programming and erasing operation. Moreover, although it is not illustrated, the flash memory 100 may include a clock generation circuit used for generating clocks.

Figure 6:
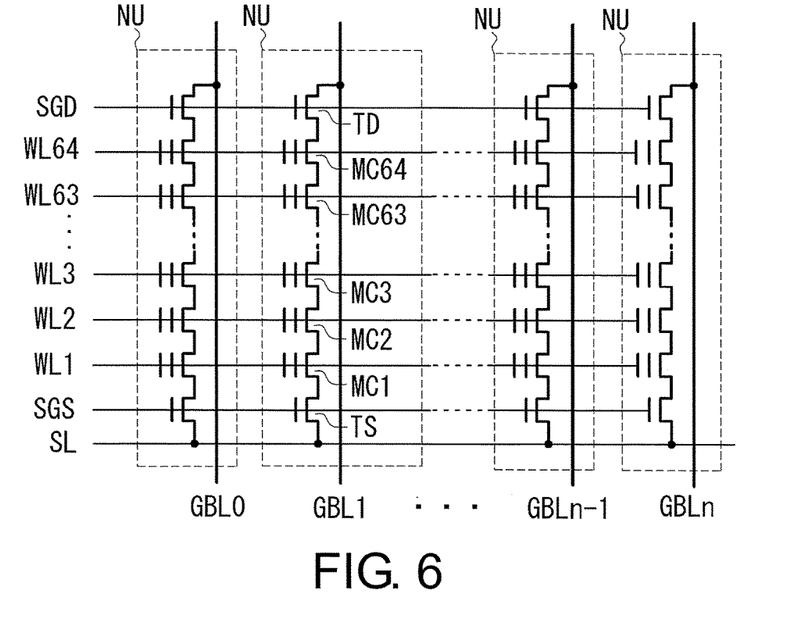
FIG. 6 is a circuit diagram of NAND stings of a memory cell array according to an embodiment of the invention.

The memory cell array 110 includes a plurality of blocks, and in one block, as shown in FIG. 6, (n+1) NAND strings NU respectively formed by a plurality of memory cells connected in series are arranged along a row direction. One NAND string NU includes a plurality of memory cells MCi (i=1, 2, 3, . . . , 64) connected in series; a bit line selection transistor TD, which is connected to one of the ends, i.e. a drain of the memory cell MC64; and a source line selection transistor TS, which is connected to a source of the memory cell MC0. A drain of the bit line selection transistor TD is connected to a corresponding one of bit lines GBL0-GBLn, and a source of the source line selection transistor TS is connected to a common source line SL.

The page buffer/reading circuit 160 holds data of a selected page of the memory cell array 110, or holds data to be programmed to the selected page of the memory cell array 110. The page buffer/reading circuit 160 may holds data of one page (for example, 2 KB), though in order to implement high-speed reading or programming, pipeline processing may be performed on data input/output. For example, when serial output of reading data is performed through an external terminal, during a period that the input/output circuit 120 serially outputs the reading data, the next reading data may be prefetched to the input/output circuit 120 from the page buffer 160.

The decoding/selecting circuit 170 is connected to the input/output circuit 120 through the data bus 190. In the present embodiment, it is assumed that the data bus 190 has 16 bits width. The decoding/selecting circuit 170 decodes the column address information Ay coming from the address register 130 to select a column of 16 bits of the page buffer/reading circuit 160. In case of the reading operation, the decoding/selecting circuit 170 selects 16 bits data from the page data held by the page buffer/reading circuit 160, and connects the selected data to the data bus 190. In case of the programming operation, the 16 bits data of the data bus 190 is connected to the column of 16 bits of the page buffer/reading circuit 160 selected by the decoding/selecting circuit 170.

The decoding/selecting circuit 170 uses the lowest bit position 2 bits of the column address to connect data of the even address to the lower bit position 8 bits of the data bus 190, and connects data of the odd address to the upper bit position 8 bits of the data bus 190. The conventional decoding/selecting circuit may have a following problem, i.e. as shown in FIG. 4B, when the start address is an odd address, since the lower bit position 8 bits of the data bus is connected with data of an even address of the start address−1, the data of the even address of the start address−1 has to be abandoned, which causes a waste, and the updating time of the data bus has to be shortened. However, the decoding/selecting circuit 170 is unnecessary to abandon the read data of the even address even if the start address is the odd address, and the updating time of the data bus may be set to be the same with the updating time of the data bus when the start address is the even address.

Figure 7A:
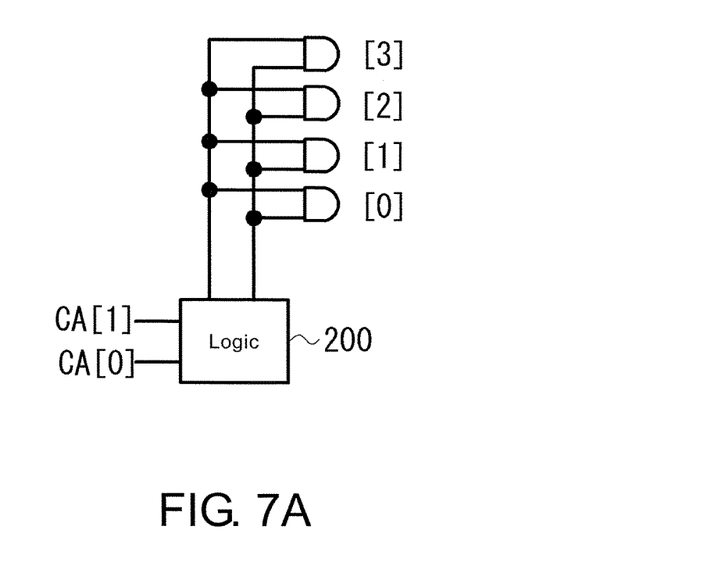
FIG. 7A and FIG. 7B are diagrams explaining a decoding method of a decoding/selecting circuit according to an embodiment of the invention.
Figure 7B:
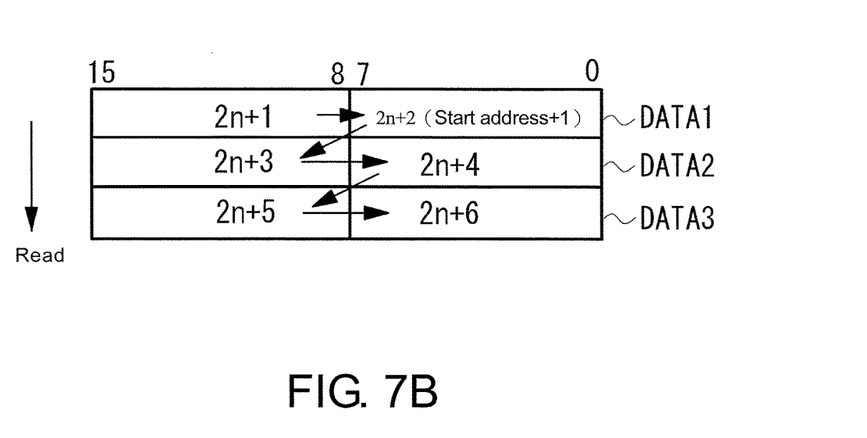

In the present embodiment, when the start address is an odd address [2n+1], the decoding/selecting circuit 170 simultaneously reads data of the start address+1, i.e. data of the even address [2n+2] next to the odd address [2n+1]. As shown in FIG. 7A, by adding a required logic circuit 200 to the column addresses CA[0], CA[1], the decoding circuit may simultaneously read the data of the even address [2n+2]. Moreover, as shown in FIG. 7B, after outputting the data of the odd address [2n+1] of the data DATA1 read from the page buffer/reading circuit 160, the input/output circuit 120 outputs the data of the even address [2n+2]. However, the above decoding method probably has a problem of multiple selection in the decoding circuit that uses the column address to generate a row selection signal and a column selection signal and selects an intersection address of the row selection signal and the column selection signal.

Figure 8A:
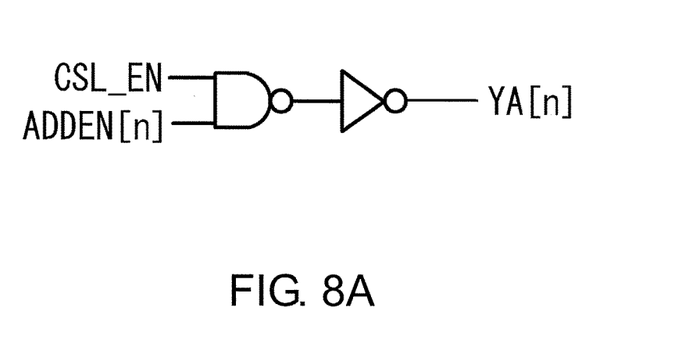
FIG. 8A and FIG. 8B illustrate a decoding circuit using row selection signals and column selection signals.
Figure 8B:
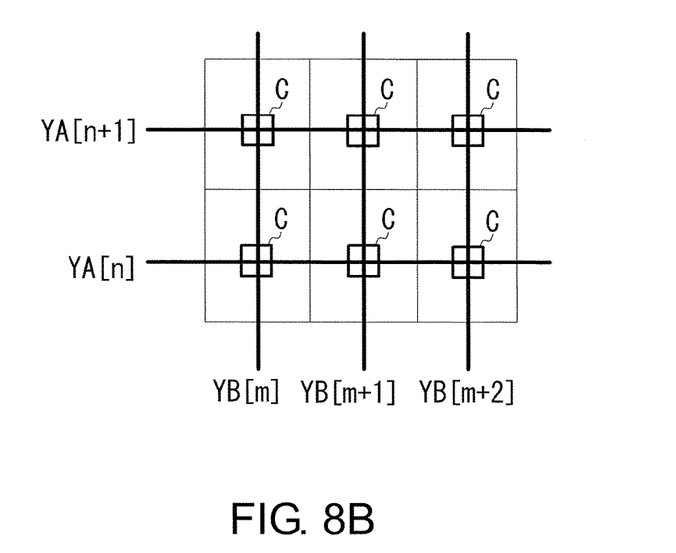

A matrix-like decoding circuit using the row selection signal and the column selection signal is expected to have a less an occupation area. FIG. 8A and FIG. 8B illustrate a decoding circuit using the row selection signals and the column selection signals. FIG. 8A illustrates an electrical composition of the decoding circuit. The decoding circuit connects the data of the odd address and the data of the even address to the upper bit position 8 bits and lower bit position 8 bits of the data bus according to the row selection signal YA[n] when the column selection signal CSL_EN and an address enable signal ADDEN[n] assert.

For example, when the page buffer 160 holds data of 1K bytes, the lower bit position 3 bits of the column address CA is decoded to generate a row selection signal YA of 8 bits. Moreover, the upper bit position of the column address CA is decoded to generate a column selection signal YB. FIG. 8B is a wiring layout of the decoding circuit, in which two row selection signals YA[n], [n+1] and three column selection signals YB[m], [m+1], [m+2] are shown. Intersections C of the row selection signals YA and the column selection signals YB represent the selected upper bit position 8 bits and lower bit position 8 bits of the data bus. A following table 1 is a truth table of the lower bit position 3 bits of the column address, and a following table 2 is a truth table of the decoding circuit. A following table 3 lists addresses selected by the decoding circuit according to the start addresses, and the left part shows the primarily selected addresses of the lower bit position 8 bits, and the right part shows the secondarily selected address of the upper bit position 8 bits.

TABLE 1

| CA | | | |
|---|---|---|---|
| <2> | <1> | <0> | ADDEN |
| 0 | 0 | 0 | 0 |
| 0 | 0 | 1 | 1 |
| 0 | 1 | 0 | 2 |
| 0 | 1 | 1 | 3 |
| 1 | 0 | 0 | 4 |
| 1 | 0 | 1 | 5 |
| 1 | 1 | 0 | 6 |
| 1 | 1 | 1 | 7 |

TABLE 2

| YA | | | | | | | |
|---|---|---|---|---|---|---|---|
| <7> | <6> | <5> | <4> | <3> | <2> | <1> | <0> |
| 0 | 0 | 0 | 0 | 0 | 0 | 1 | 1 |
| 0 | 0 | 0 | 0 | 0 | 0 | 1 | 1 |
| 0 | 0 | 0 | 0 | 1 | 1 | 0 | 0 |
| 0 | 0 | 0 | 0 | 1 | 1 | 0 | 0 |
| 0 | 0 | 1 | 1 | 0 | 0 | 0 | 0 |
| 0 | 0 | 1 | 1 | 0 | 0 | 0 | 0 |
| 1 | 1 | 0 | 0 | 0 | 0 | 0 | 0 |
| 1 | 1 | 0 | 0 | 0 | 0 | 0 | 0 |

TABLE 3

| | lower bit position 8 bits | | upper bit position 8 bits | |
|---|---|---|---|---|
| start address | 1stYA | 1stYB | 2ndYA | 2ndYB |
| 0 h (0 000b) | YA[0] | YB[0] | YA[1] | YB[0] |
| 1 h (0 001b) | YA[0] | YB[0] | YA[1] | YB[0] |
| 7 h (0 111b) | YA[6] | YB[0] | YA[7] | YB[0] |
| 15 h (1 111b) | YA[6] | YB[1] | YA[7] | YB[1] | unused data of the even address

The decoding circuit selects two rows YA[n], [n+1] according to the row selection signal YA[n], and selects one column YB[m] according to one column selection signal YB. For example, when the start address is an even address "0h", the addresses YA[0], YB[0] and the addresses YA[1], YB[0] are selected, and when the start address is an odd address "1h", the addresses YA[0], YB[0] and the addresses YA[1], YB[0] are also selected. In case that the start address is the odd address, as shown by dot lines of the table 3, the lower bit position 8 bits data of the even address is not used, which is equivalent to the decoding circuit shown in FIG. 2C.

In the decoding circuit shown in FIG. 8A and FIG. 8B, in case that the start address is the odd address, if it is indented to load the data of the even address [2n+2](the start address+1) to the lower bit position 8 bits of the data bus, the problem of multiple selection is occurred when the column selection signal YB is carried. For example, when the start address is "7h", the data of the even address "8h" (the start address+1) is loaded to the lower bit position 8 bits of the data bus, though "8h" is the address selected according to the next 8 bits row selection signal, i.e. the address selected according to the carried YB[1]. Therefore, when the start address is "7h", the data of the upper bit position 8 bits has to be selected according to the column selection signal YB[0], and the data of the lower bit position 8 bits is selected according to the column selection signal YB[1]. Namely, two addresses have to be selected according to two column selection signals.

Figure 9A:
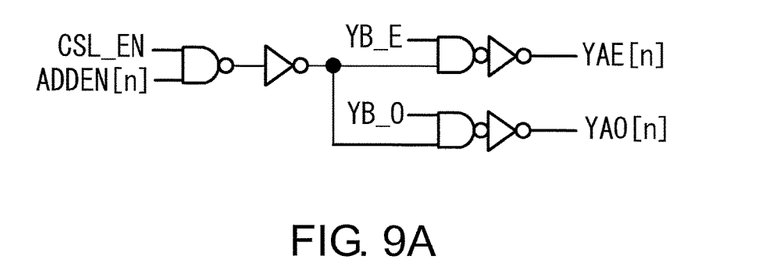
FIG. 9A illustrates a composition of the decoding circuit.
Figure 9B:
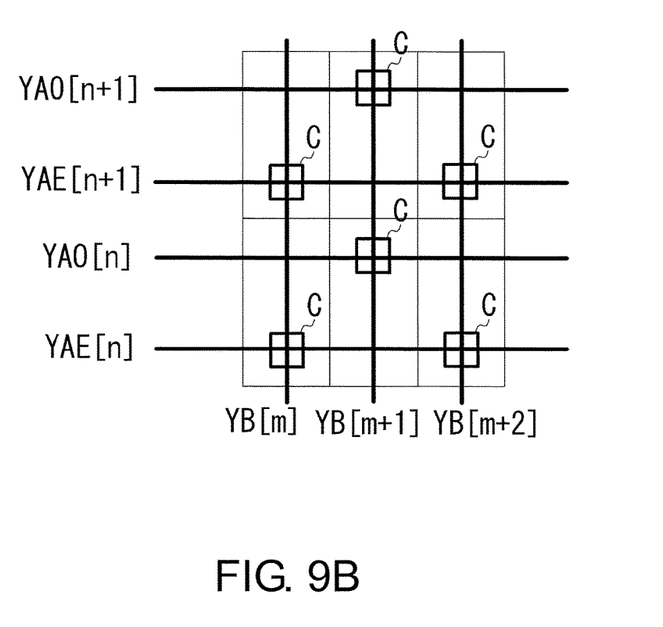
FIG. 9B illustrates a wiring layout.

In the present embodiment, in order to avoid such multiple selection, a decoding circuit shown in FIG. 9A and FIG. 9B is adopted. As shown in FIG. 9B, the decoding circuit of the present embodiment selects the upper bit position 8 bits and the lower bit position 8 bits of the data bus 190 according to row selection signals YAE[n], [n+1] corresponding to column selection signals YB[m], [m+2] and row selection signals YAE[n], [n+1] corresponding to a column selection signal YB[m+1].

FIG. 9A illustrates an electrical composition of the decoding circuit. The decoding circuit of the present embodiment includes two NAND gates NAND_1, NAND_2 connected to an output node N of the column selection signal CSL_EN and the address enable signal ADDEN[n]; and two inverters IN_1, IN_2 connected to the two NAND gates NAND_1, NAND_2. One of input terminals of the NAND gate NAND_1 is connected to the node N, and the other input terminal thereof is connected to a column selection signal YB_E, and the inverter IN_1 outputs a row selection signal YAE[n]. One of input terminals of the NAND gate NAND_2 is connected to the node N, and the other input terminal thereof is connected to a column selection signal YB_O, and the inverter IN_2 outputs a row selection signal YAO[n]. The column selection signals YB_E, YB_O represent even/odd signals of YB signals obtained by using the upper bit position addresses of the column address for decoding. A following table 4 is a truth table of YB[0], a following table 5 is a truth table of the decoding circuit of the present embodiment, and a following table 6 lists bits of the upper bit position and lower bit position of the data bus selected according to the start addresses.

TABLE 4

| YB[0] | YB_E | YB_0 |
|---|---|---|
| 0 | 1 | 0 |
| 1 | 0 | 1 |

TABLE 5

| YA | | | | | | | |
|---|---|---|---|---|---|---|---|
| <7> | <6> | <5> | <4> | <3> | <2> | <1> | <0> |
| 0 | 0 | 0 | 0 | 0 | 0 | 1 | 1 |
| 0 | 0 | 0 | 0 | 0 | 1 | 1 | 0 |
| 0 | 0 | 0 | 0 | 1 | 1 | 0 | 0 |
| 0 | 0 | 0 | 1 | 1 | 0 | 0 | 0 |
| 0 | 0 | 1 | 1 | 0 | 0 | 0 | 0 |
| 0 | 1 | 1 | 0 | 0 | 0 | 0 | 0 |
| 1 | 1 | 0 | 0 | 0 | 0 | 0 | 0 |
| 1 | 0 | 0 | 0 | 0 | 0 | 0 | 1 |

TABLE 6

| | lower bit position 8 bits | | upper bit position 8 bits | |
|---|---|---|---|---|
| start address | 1stYA | 1stYB | 2ndYA | 2ndYB |
| 0 h (0 000b) | YAE[0] | YB[0] | YAE[1] | YB[0] |
| 1 h (0 001b) | YAE[1] | YB[0] | YAE[2] | YB[0] |
| 7 h (0 111b) | YAE[7] | YB[0] | YAO[0] | YB[1] |
| 15 h (1 111b) | YAO[7] | YB[1] | YAE[0] | YB[2] |

For example, when the start address is "0h", the row selection signal YAE[0] is enabled, and the intersection C of the row YAE[0] and the column YB[0] and the intersection C of the row YAE[1] and the column YB[0] are simultaneously selected. When the start address is the odd address "1h", the intersection C of the row YAE[1] and the column YB[0] and the intersection C of the row YAE[2] and the column YB[0] are simultaneously selected. When the start address is the odd address "7h", the intersection C of the row YAE[7] and the column YB[0] is selected, and since the column YB becomes the odd number [1] through carry, the intersection C of the row YAO[0] and the column YB[1] is simultaneously selected. When the start address is the odd address "15h", since the column YB is an odd number, the intersection C of the row YAO[7] and the column YB[1] is selected, and since the column YB becomes the even number [0], the intersection C of the row YAE[0] and the column YB[2] is simultaneously selected.

Figure 10A:
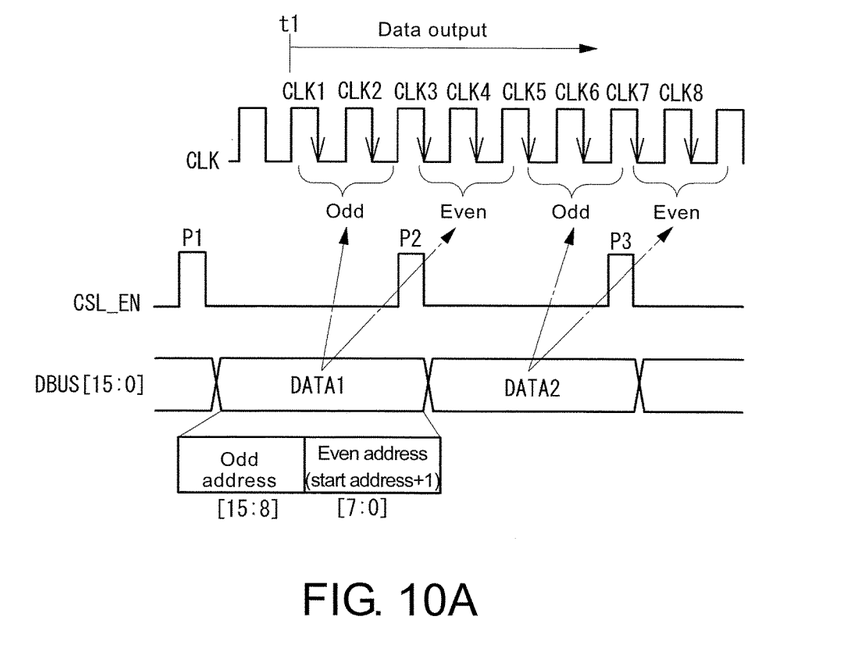
FIG. 10A and FIG. 10B are a timing diagram of a serial reading operation of the flash memory of the present embodiment when the start address is an odd address.
Figure 10B:
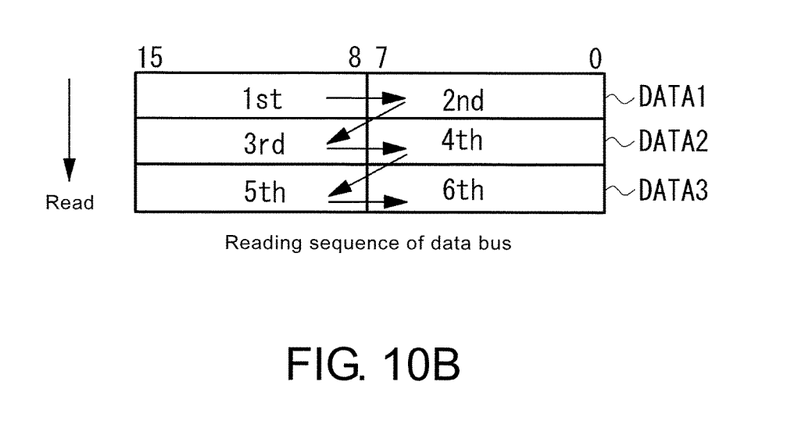

FIG. 10A and FIG. 10B are a timing diagram of a serial reading operation of the flash memory of the present embodiment when the start address is an odd address. The decoding/selecting circuit 170 selects reading data DATA1 of 2 bytes from the page buffer 160 in response to a pulse P1 of the column selection signal CSL_EN, and loads data of the even address of the start address+1 to a lower bit position address of 8 bits of the data bus 190, and loads data of the start address to an upper bit position address of 8 bits of the data bus 190. The input/output circuit 120 serially outputs data of the odd address of the reading data DATA1 in synchronous with the clocks CLK1, CLK2, and serially outputs data of the even address in synchronous with the clocks CLK3, CLK4. If the page buffer 160 and the input/output circuit 120 are composed of pipelines, when data output of the odd address is ended, the decoding/selecting circuit 170 selects next reading data DATA2 from the page buffer 160 in response to a next pulse P2, and loads the selected data DATA2 to the input/output circuit 120 through the data bus 190.

Moreover, in case that the start address is an even address, similar to the conventional technique, the data of the even address is read from the data bus according to a sequence shown in FIG. 3B, and the input/output circuit 120 outputs the data of the odd address after outputting the data of the even address.

In this way, in the present embodiment, even if the start address is the odd address, it is unnecessary to abandon the data of the even address read from the page buffer as that does in the prior art, and the data of the even address may be utilized. Moreover, it is unnecessary to shorten an update cycle (a period between the pulse P1 and the pulse P2) of the data bus as that does in the prior art, which ensures a margin of the internal timing, and a high-frequency operation may be implemented. Therefore, in the decoding circuit using the row selection signal and the column selection signal, by preparing two sets of row selection signals respectively corresponding to the even column selection signal and the odd column selection signal, the problem of multiple selection occurred in carry of the column address is avoided.

Then, a second embodiment of the invention is described below. In the second embodiment, a NAND flash memory having a serial interface is provided, though the invention is not limited thereto, and a flash memory inputting or outputting data in parallel through a plurality of external terminals is also applicable.

Figure 11A:
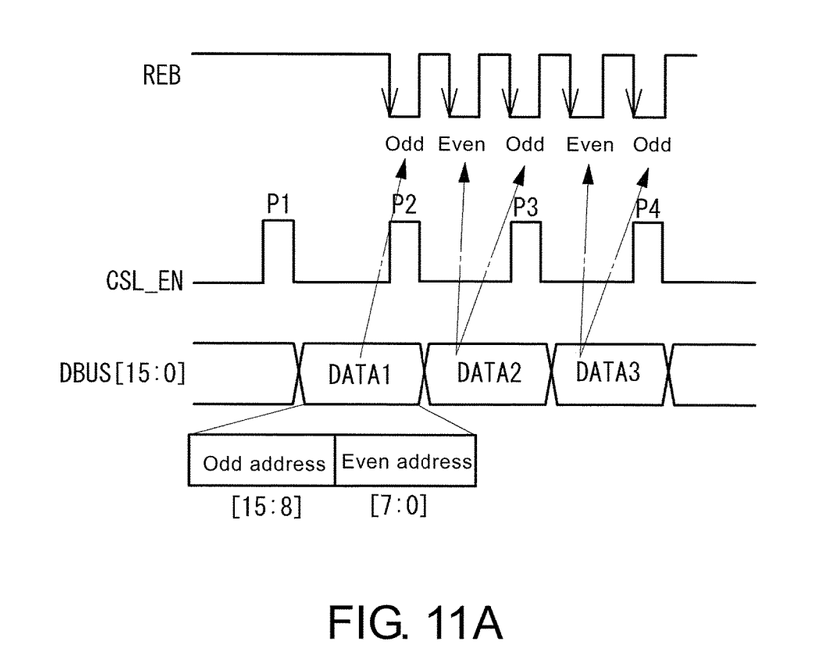
FIG. 11A and FIG. 11B are a timing diagram of a parallel reading operation of the flash memory of a conventional flash memory when the start address is an odd address.
Figure 11B:
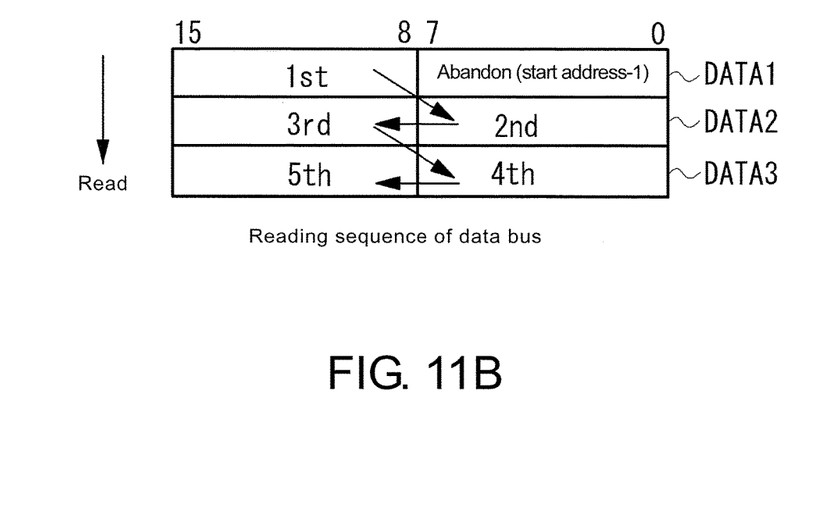
Figure 12A:
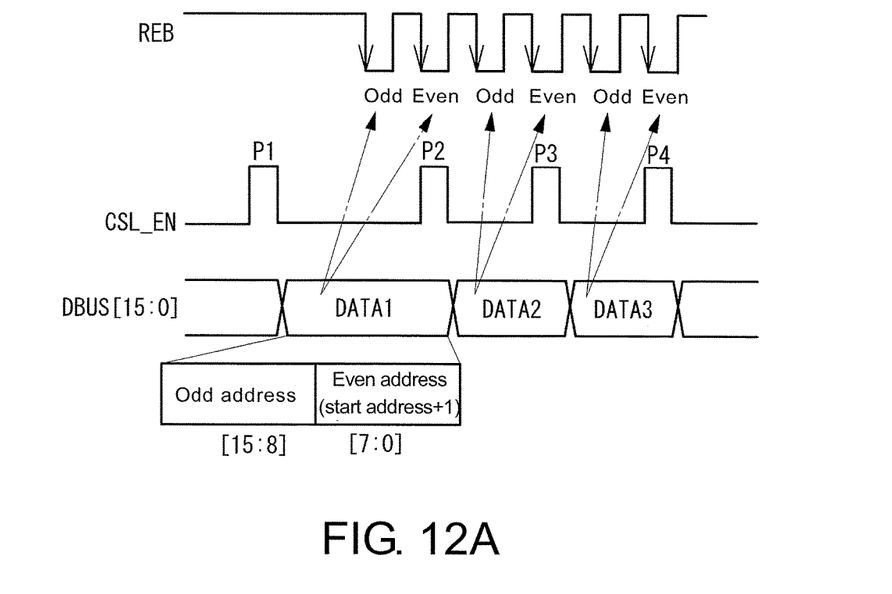
FIG. 12A and FIG. 12B are a timing diagram of a parallel reading operation of the flash memory of the present embodiment when the start address is an odd address.
Figure 12B:
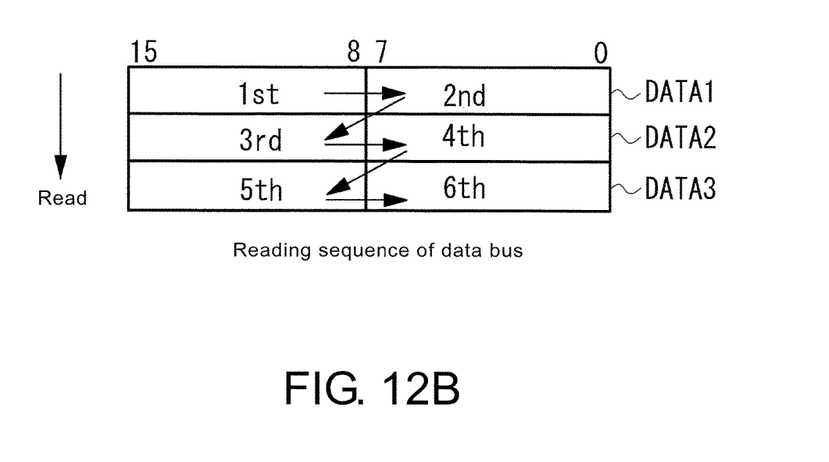

FIG. 11A and FIG. 11B, FIG. 12A and FIG. 12B are reading timing diagrams of a flash memory inputting/outputting data in parallel, and FIG. 11A and FIG. 11B are a conventional example of loading data of an even address of the start address−1 when the start address is an odd address, and FIG. 12A and FIG. 12B are an example of loading data of an even address of the start address+1 when the start address is an odd address according to the embodiment of the invention. In FIG. 11A and FIG. 11B, in response to the pulse P1 of the column selection signal CSL_EN, the decoding/selecting circuit 170 selects reading data DATA1 of 2 bytes from the page buffer 160 according to the column address, and loads the selected data DATA1 to the input/output circuit 120 through the data bus 190. The input/output circuit 120 outputs the data of the odd address of the upper bit position 8 bits of the reading data DATA1 through the external terminals×8 in response to a falling edge of a pulse of a write enable signal REB. Thereafter, the decoding/selecting circuit 160 selects the data DATA2 of the next 2 bytes in response to the pulse P2, and loads the selected data DATA2 to the input/output circuit 120 through the data bus 190. The input/output circuit 120 outputs the data of the even address of the lower bit position 8 bits of the data DATA2 in response to a falling edge of a next pulse of the write enable signal REB, and outputs the data of the odd address of the upper bit position 8 bits of the data DATA2 in response to the falling edge of the next pulse. As shown in FIG. 11B, the conventional reading method may abandon the data of the even address of the data DATA1, which is not efficient reading.

In the reading operation of the present embodiment, similar to the aforementioned embodiment, in case that the start address is the odd address, the data of the start address and the data of the even address next to the start address are loaded to the data bus 190, so that it is unnecessary to abandon the data of the even address, so as achieve non-waste reading. Moreover, the update cycle of the data bus 190 is not limited by a reading period of data of 1 byte, so that the margin of the internal timing is guaranteed.

In the present embodiment, the data bus 190 having 16 bits width is taken as an example for description, though the invention is not limited thereto, and the bit width of the data bus may also be enlarged, for example, the data bus may have 32 bits width, 64 bits width, etc. When the data bus is the 32 bits width, the decoding/selecting circuit selects 32 bits data from the page buffer in each reading operation, and connects 8 bits data to [31:24], [23:16], [15:8], [7:0] of the data bus according to 2 bits "11", "10", "01", "00" of the column addresses CA[0], CA[1]. Moreover, when the data bus is the 64 bits width, the decoding/selecting circuit selects 64 bits data from the page buffer in each reading operation, and connects 8 bits data to [63:56], [55:48], . . . , [15:8], [7:0] of the data bus according to 3 bits "111", "110", . . . , "001", "000" of the column addresses CA[0], CA[1], CA[2]. Even if the data bus has the 32 bits width or the 64 bits width, the decoding/selecting circuit may also avoid the problem of accidental multiple selection when the column selection signal is carried (for example, in case of 16 bits, it is the selection signal of 2 rows×2 columns, and in case of 32 bits, it is the selection signal of 3 rows×2 columns). For example, in case of 32 bits, when the start address is [010], data of the start address [010], [011] and data of the carried address

What is claimed is:

1. A semiconductor memory device, comprising:
   a memory cell may;
   a row selection part, selecting a row of the memory cell array;
   a holding part, holding data selected by the row selection part;
   a selecting part, selecting n bits data from the data held by the holding part based on a column address; and
   a data bus for n bits, connected to the selecting part,
   wherein the selecting part connects n/2 bits data of an even address to a lower bit position of the data bus and connects n/2 bits data of an odd address to an upper bit position of the data bus based on the column address,
   when a start address is the odd address, the selecting part selects data of the odd address and data of the even address next to the odd address.

2. The semiconductor memory device as claimed in claim 1, further comprising:
   an output part, capable of alternately outputting the data of the even address and the data of the odd address,
   wherein the output part serially outputs the data of the even address and the data of the odd address through external terminals in synchronous with a clock signal.

3. The semiconductor memory device as claimed in claim 1, wherein
   the selecting part comprises a row selection signal generated from the column address and a column selection signal generated from the column address, and the n/2 bits data of the even address and the n/2 bits data of the odd address are connected to the lower bit position and the upper bit position of the data bus based on the row selection signal and the column selection signal.

4. The semiconductor memory device as claimed in claim 3, wherein
   the selecting part comprises a first row selection signal corresponding to the column selection signal of an even number and a second row selection signal corresponding to the column selection signal of an odd number, and selects a row through the first row selection signal or the second row selection signal in response to carry of the column selection signal.

5. The semiconductor memory device as claimed in claim 1, wherein
   the holding part is a page buffer holding data read from a selected page of the memory cell array, or data to be programmed to the selected page of the memory cell array.

6. The semiconductor memory device as claimed in claim 5, wherein a bit width of the data bus is less than an amount of bits held by the page buffer, and an amount of external terminals used for inputting and outing data is less than the bit width of the data bus.

7. The semiconductor memory device as claimed in claim 1, wherein
   the semiconductor memory device is an NAND flash memory.

8. A reading method of a semiconductor memory device, wherein the semiconductor memory device comprises a memory cell array; a row selection part used for selecting a row of the memory cell array; a holding part used for holding data selected by the row selection part; a selecting part used for selecting n bits data from the data held by the holding part based on a column address; and a data bus for n bits, which is connected to the selecting part, the reading method comprising:
   in case that a start address is an odd address, connecting data of the odd address and data of an even address next to the odd address to the data bus by the selecting part based on the column address; and
   outputting the data of the even address after outputting the data of the odd address connected to the data bus.

9. The reading method of the semiconductor memory device as claimed in claim 8, wherein
   in case that the start address is an even address, connecting data of the even address and data of an odd address next to the even address to the data bus by the selecting part; and
   outputting the data of the odd address after outputting the data of the even address connected to the data bus.

10. The reading method of the semiconductor memory device as claimed in claim 8, wherein
    the data of the even address and the data of the odd address are serially output through external terminals in synchronous with a serial clock signal.

11. The reading method of the semiconductor memory device as claimed in claim 8, wherein
    n/2 bits data of an even address is connected to a lower bit position of the data bus, and n/2 bits data of an odd address is connected to an upper bit position of the data bus.

12. A reading method of a semiconductor memory device, wherein the semiconductor memory device comprises a memory cell array; a row selection part used for selecting a row of the memory cell array; a holding part used for holding data selected by the row selection part; a selecting part used for selecting n bits data from the data held by the holding part based on a column address; and a data bus for n bits, which is connected to the selecting part, the reading method comprising:
   in case that a start address is not a head address of the data bus for n bits, selecting one or a plurality of data of addresses except the head address and data of the address after carry;
   in case that a start address is an odd address, connecting data of the odd address and data of an even address next to the odd address to the data bus by the selecting part based on the column address; and
   outputting the data of the even address after outputting the data of the odd address connected to the data bus.

* * * * *